United States Patent [19]
Chu et al.

[11] Patent Number: 5,484,738
[45] Date of Patent: Jan. 16, 1996

[54] METHOD OF FORMING SILICON ON OXIDE SEMICONDUCTOR DEVICE STRUCTURE FOR BICMOS INTEGRATED CIRCUITS

[75] Inventors: Shao-Fu S. Chu, Poughkeepsie; Chang-Ming Hsieh; Louis L. C. Hsu, both of Fishkill; Kyong-Min Kim, Hopewell Junction; Shaw-Ning Mei, Wappingers Falls, all of N.Y.

[73] Assignee: International business Machines Corporation, Armonk, N.Y.

[21] Appl. No.: 396,985

[22] Filed: Mar. 1, 1995

Related U.S. Application Data

[62] Division of Ser. No. 242,992, May 16, 1994, abandoned, which is a continuation of Ser. No. 900,028, Jun. 17, 1992, abandoned.

[51] Int. Cl.$^6$ .............................................. H01L 21/265
[52] U.S. Cl. ...................... 437/33; 437/31; 437/59; 437/63; 437/67; 148/DIG. 10; 148/DIG. 11; 148/DIG. 12; 148/DIG. 50; 148/DIG. 151; 257/347; 257/507
[58] Field of Search .................... 437/31, 63, 67, 437/33, 59; 148/DIG. 12, DIG. 50, DIG. 51, DIG. 10, DIG. 11; 257/347, 507

[56] References Cited

U.S. PATENT DOCUMENTS

| | | |
|---|---|---|
| 3,385,729 | 5/1968 | Larchian . |
| 3,913,121 | 10/1975 | Youmans et al. . |
| 4,561,172 | 12/1985 | Slawinski et al. . |
| 4,672,410 | 6/1987 | Miura et al. . |
| 4,897,362 | 1/1990 | Delgado et al. ............................ 437/67 |
| 4,908,328 | 3/1990 | Hu et al. . |
| 5,164,218 | 11/1992 | Tsuruta et al. .................... 148/DIG. 12 |
| 5,298,450 | 3/1994 | Verret ............................. 148/DIG. 50 |
| 5,356,827 | 10/1994 | Ohoka ........................................ 437/63 |

FOREIGN PATENT DOCUMENTS

| | | |
|---|---|---|
| 0079632 | 5/1982 | Japan ........................................ 437/67 |
| 59-182566 | 10/1984 | Japan . |
| 2076645 | 4/1987 | Japan ............................. 148/DIG. 12 |
| 0054740 | 3/1988 | Japan ............................. 148/DIG. 12 |
| 0205926 | 8/1988 | Japan ............................. 148/DIG. 12 |
| 0202034 | 8/1988 | Japan ........................................ 437/67 |
| 0267949 | 11/1990 | Japan ............................. 148/DIG. 12 |
| 3232239 | 10/1991 | Japan ............................. 148/DIG. 12 |
| 3265154 | 11/1991 | Japan ............................. 148/DIG. 12 |
| 3265155 | 11/1991 | Japan ............................. 148/DIG. 12 |
| 4030449 | 2/1992 | Japan ............................. 148/DIG. 12 |

OTHER PUBLICATIONS

C. Harendt et al.; "Silicon–on–Insulator Films Obtained by Etchback of Bonded Wafers"; Journal of the Electrochemical Society, vol. 136, No. 11, Nov. 1989; pp. 3547–3548.
W. P. Maszara et al.; "Bonding of Silicon Wafers for Silicon–on–Insulator"; Journal of Applied Physics, vol. 64, No. 9, 1 Nov. 1988; pp. 4943–4950.
A. M. Healy; "Integrated Semiconductor Device"; IBM Technical Disclosure Bulletin, vol. 8, No. 7, 7 Dec. 1965; pp. 1016–1017.

*Primary Examiner*—Olik Chaudhuri
*Assistant Examiner*—Long Pham
*Attorney, Agent, or Firm*—Whitham, Curtis, Whitham & McGinn; Harold Huberfeld

[57] ABSTRACT

A bonded, SOI wafer which has stepped isolation trenches and sublayer interconnections first formed in a bulk silicon wafer. After these process steps are complete, a thin polysilicon layer is formed on the planarized upper surface of the bulk silicon wafer. This thin polysilicon layer is then bound to an oxide layer on the surface of a separate wafer to form a bonded silicon-on-oxide structure. The entire assembly is, in effect inverted, and what had been the lower surface of the bulk silicon wafer, is removed to the bottom of the deepest trench step. In this bonded SOI structure, regions between the trenches are deep and suitable for bipolar device fabrication, while the trench steps form shallow regions suitable for fabrication of CMOS devices.

4 Claims, 4 Drawing Sheets

METHOD OF FORMING SILICON ON OXIDE SEMICONDUCTOR DEVICE STRUCTURE FOR BICMOS INTEGRATED CIRCUITS

This is a Divisional Application of application Ser. No. 08/242,992, filed May 16, 1994 now abandoned, which is a continuation of application Ser. No. 07/900,028, filed Jun. 17, 1992, now abandoned.

BACKGROUND OF THE INVENTION

1. Field of the Invention

This invention relates to a novel silicon-on-oxide (SOI) integrated circuit structure and method of making such structures, and more particularly, to an SOI structure and fabrication process suitable for concurrent fabrication of bipolar and CMOS devices; so-called BiCMOS devices.

2. Description of the Prior Art

Bipolar and CMOS devices built on silicon on insulator (SOI) wafers can achieve significantly improved performance as compared to those built on the conventional bulk silicon wafers. Bipolar devices (for example, ECL, and SRAM on SOI), have excellent soft error immunity. MOS devices fabricated on a very thin SOI layer, with fully depleted channels, have a mobility on the order of twice that of comparable bulk silicon devices and up to a forty percent improvement in transconductance. Concurrent fabrication of bipolar and CMOS devices on SOI wafers is, therefore, clearly advantageous for high-speed, high-density integrated circuits.

However, prior art SOI proposals for BiCMOS applications have not been altogether satisfactory. Thin SOI wafers created by high energy, high dose oxygen implant, have been found to have a high defect density, and are expensive. SOI wafers made by bonding methods experience difficulty in controlling silicon layer thickness and wafer to wafer uniformity. Further, with a bonded SOI process, it has heretofore been impractical to form thin layer silicon and thick layer silicon on the same substrate.

Further, typical device fabrication requires a number of high temperature process steps which stress the buried oxide layer in an SOI device and create defects that degrade device performance.

SUMMARY OF THE INVENTION

An object of this invention is a BiCMOS, bonded SOI structure in which deep and shallow SOI regions are formed simultaneously on the same substrate, such that deep regions will be used for bipolar while shallow regions for CMOS.

Another object is a BiCMOS process in which hot process steps such as sub-collector formation, reach-through implant, and trench isolations, are completed prior to SOI bonding, and high temperature epitaxial process steps are not required.

A further object of the invention is to be able to build BiCMOS devices on an original wafer substrate with good crystal quality, and with a final structure that is planar.

One more object is a BiCMOS device in which low resistivity p-type and n-type sub-collectors can be formed easily and can be used for transistor as well as local interconnection.

Yet another object is to confine defects caused by reach-through ion implant in a fully isolated reach-through region that does not affect the device junction quality.

Briefly, this invention contemplates the provision of a BiCMOS structure on a bonded, SOI wafer in which stepped isolation trenches and sublayer interconnections are first formed in a bulk silicon wafer, i.e., a wafer without a buried oxide layer. After these process steps are complete, a thin polysilicon layer is formed on the planarized upper surface of the bulk silicon wafer. This thin polysilicon layer is then bound to an oxide layer on the surface of a separate wafer to form a bonded silicon-on-oxide structure. The entire assembly is, in effect inverted, and what had been the lower surface of the bulk silicon wafer, is removed to the bottom of the deepest trench step. In this bonded SOI structure, the deep SOI regions are suitable for bipolar device fabrication, while the trench steps form shallow SOI regions suitable for fabrication of CMOS devices.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
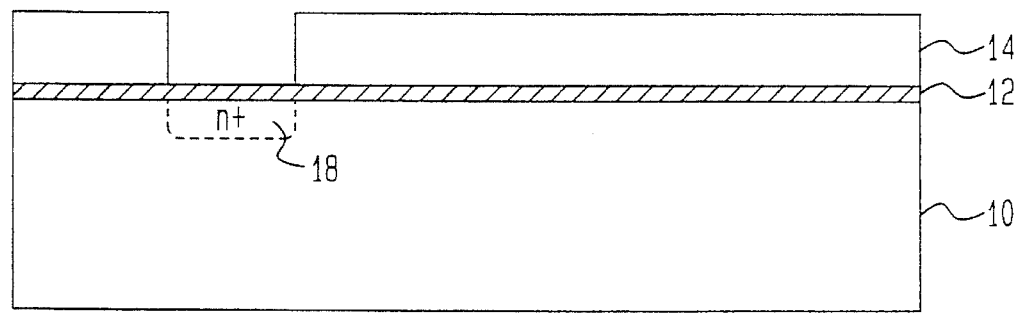
FIGS. 1 through 9 illustrate the process steps in the fabrication of a BiCMOS compatible bonded SOI structure in accordance with the teachings of this invention.

Referring now to the drawings, and more particularly to FIG. 1, the process for this particular embodiment of the invention starts with an n-type, bulk, silicon wafer 10 with a doping concentration of approximately $1 \times 10^{16}$ atoms/cm$^3$. Obviously, a wafer with a different doping concentration, and/or p-type doping could be used, depending on the final device requirements. A thin layer 12 (about 3000 Å) of oxide/nitride composite film is deposited on the surface of the wafer 10 by a chemical vapor deposition (CVD) process and a resist 14 is then formed over the surface of the CVD oxide/nitride layer 12. The resist 14 is patterned and an opening in the oxide/nitride layer 12 is etched to form a reach-through opening through which an implant is made to form an n+ region 18. The n+ region 18 can be made by implanting arsenic or phosphorus ions so that after a bonding heat cycle the depth of the region is at least 0.5 μm. The device at this stage is shown in FIG. 1.

Figure 2:
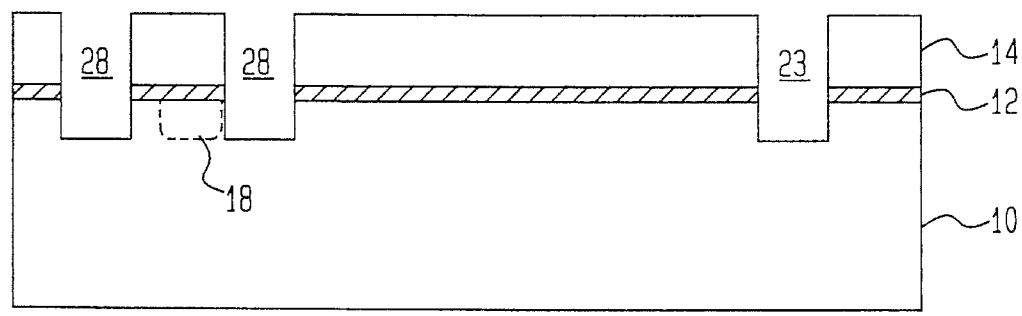

Trenches in the bulk silicon wafer 10 are next formed to define what will become relatively shallow and relatively deep semiconductor regions in the final structure. A SF$_6$/Cl$_2$ plasma is used to etch the trenches in the wafer 10. Trench segments are formed by an initial patterning of and etching through openings 23 in the resist 14, and openings in the layer 12. The bulk silicon wafer 10 is etched through these openings to a depth of less than 0.3 μm. FIG. 2 illustrates this stage of the process. For shallow trenches, no further etching is needed.

Figure 3:
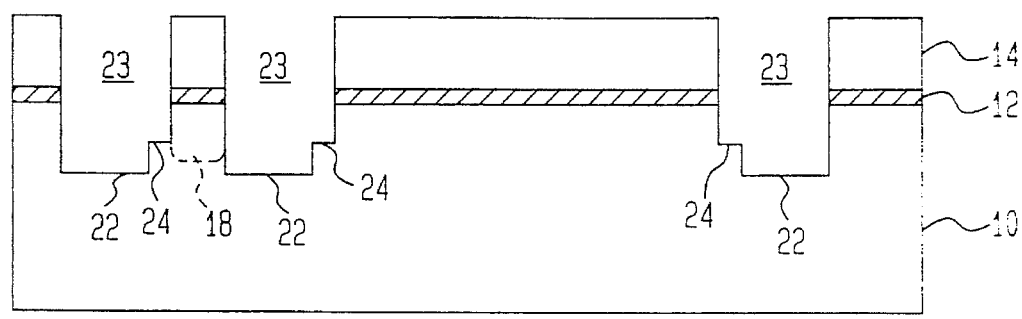

For deep trenches, the openings 23 are enlarged with pattern and etched, and the trenches deepened to about 2.5 μm or less, thus forming a stepped trench with initially started trench segments 22 and those subsequently started segments indicated at 24 in FIG. 3.

Figure 4:
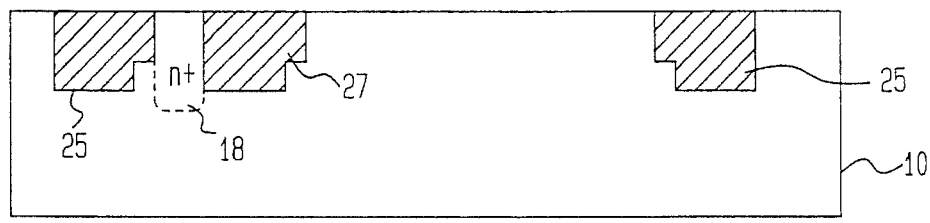

The resist 14 is removed and a thin layer of oxide (not shown) is grown to passivate the trench sidewalls. The stepped trenches are filled with a suitable trench dielectric material 25 using a conventional shallow trench process; for example, depositing a TEOS layer (about 3.0 µm thick) by a CVD process step and planarizing the TEOS layer by a suitable chemical-mechanical polishing step to polish back to the upper surface of the oxide/nitride polish step layer 12. After polishing, the oxide/nitride layer 12 is removed. The device at tis stage is shown in FIG. 4.

Figure 5:
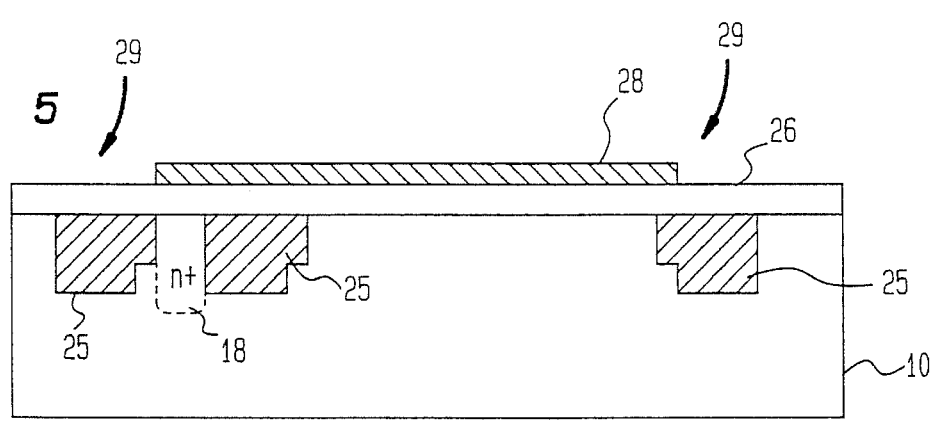
Figure 6:
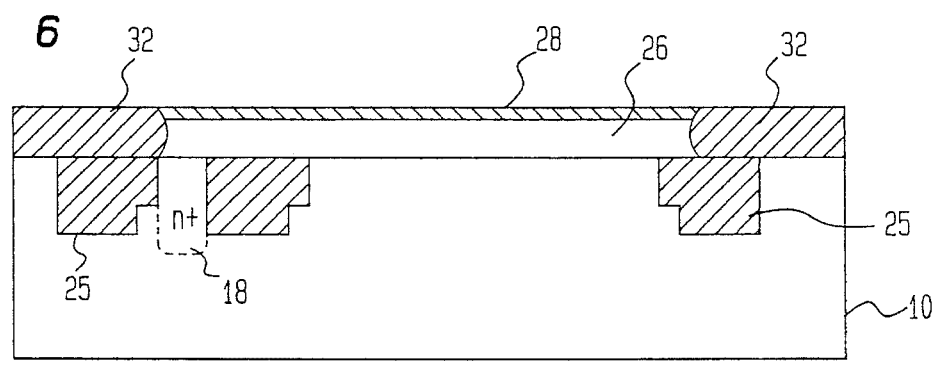

A polysilicon layer 26 is now formed by depositing polysilicon about 0.4 µm thick by CVD process step. The polysilicon layer 26 is patterned and implanted to form n+ and/or p+ sub-collectors and/or local interconnections in regions dictated by the requirements of the final device. A thermal oxide layer about 500 Å thick is grown on the surface of the layer 26 and a CVD nitride layer 28, also about 500 Å thick, is then formed on the oxide layer. This oxide/nitride layer is then patterned and etched back in order to define the sub-collector and interconnect regions indicated by the general reference numeral 29. The device at this stage is shown in FIG. 5. The exposed regions 29 of the polysilicon layer 26 are recess etched to a depth of about 2000 Å and a thermal oxide 32 is grown to consume all the exposed portions of the layer 26. The device at this stage is shown in FIG. 6.

Figure 7:
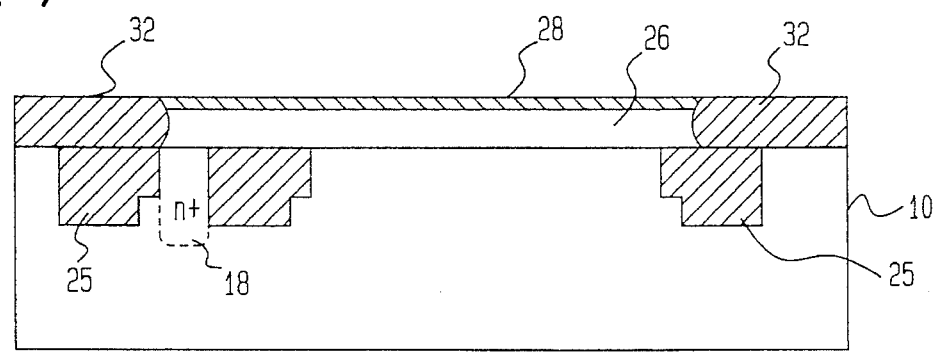
Figure 8:
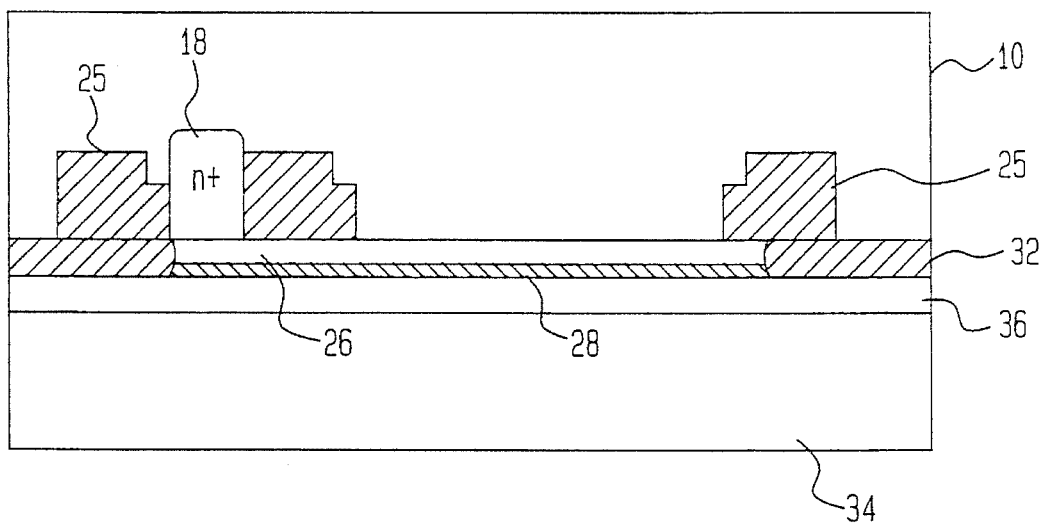

The nitride layer 28 is used as a chemical-mechanical polish stop and the surface of oxide 32 is planarized by chemical-mechanical polishing. The device at this stage is shown in FIG. 7. The structure shown in FIG. 7 is then "flipped over" and bonded to a semiconductor wafer 34 whose upper surface has been oxidized to for oxide layer 36 as shown in FIG. 8. A conventional bonding process may be used to bond the structure shown in FIG. 7 to the oxide layer 36; for example, the assembly is subjected to a temperature in the range of 850° C. to 1100° C., which will also activate the sub-collector dopants and perform a drive in operation for the reach-through region 18. Further details of this bonding step are set forth in C. Harendt, et al., "Silicon-on-Insulator Films Obtained by Etchback of Bonded Wafers", *J. Electrochem. Soc.* Vol. 136, No. 11, November 1989, pp. 3547–3548 and W. P. Maszara, et al., "Bonding of Silicon Wafers for Silicon-On-Insulator", *J. Appl. Phys.* Vol. 64, No. 10, November 1988, pp. 4943–4950.

Figure 9:
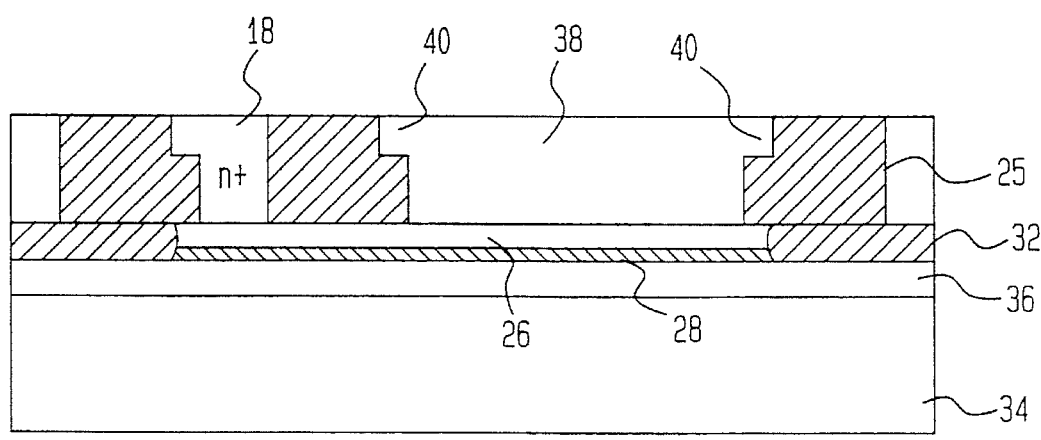
Figure 10:
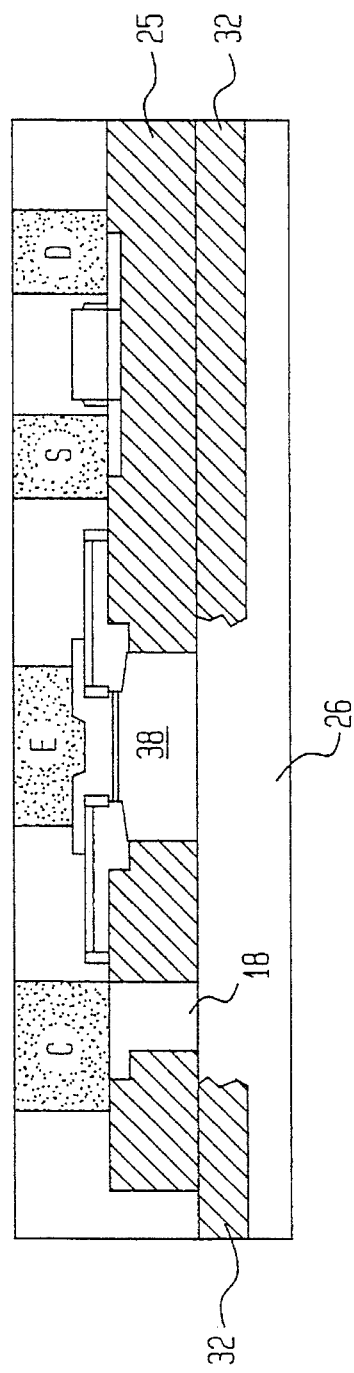
FIGS. 10 and 11 show, respectively, a sectional view and a plan view of a BiCMOS device fabricated on an SOI structure constructed in accordance with the teachings of this invention.
Figure 11:
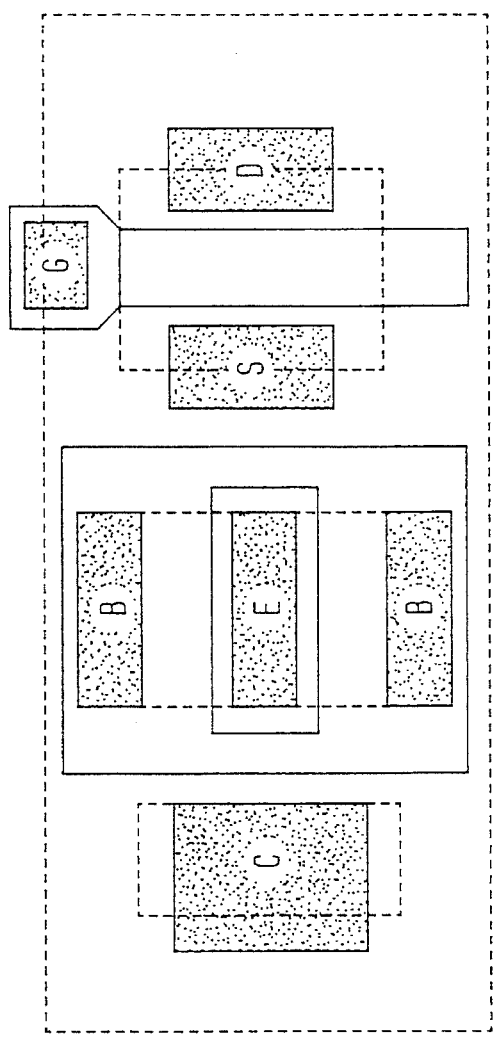

Next, what has become the upper surface of the silicon wafer 10, is chemically-machine polished back to what is now the upper surface of the trench segments 22. (See FIG. 9.) At this point, it will be appreciated that a SOI structure with deep silicon regions 38, is in a range between 1 µm and 2.5 µm, shallow silicon regions 40 less than 3000 Å deep, and reach-through region 18. Devices can be fabricated in these regions using conventional process steps dictated by the type or types of devices desired. For example, emitter, intrinsic base and collector can be built at region 38 and the extrinsic base can be built at region 40. Hereby, the base to collector junction capacitance can be very small. As will be readily appreciated by those skilled in the art, MOSFET devices can be constructed in the shallow SOI regions, while bipolar transistors can be formed readily in the deep SOI region. FIG. 10 is a cross-sectional view of an exemplary BiCMOS structure; the layout of this BiCMOS structure is shown in FIG. 11.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of fabricating a silicon-on-oxide integrated circuit structure with bipolar and MOS device regions in said structure, comprising the steps:

forming a plurality of isolation trenches in a semiconductor wafer extending from one surface of said wafer into said wafer, certain ones of said isolation trenches extending to a first depth in said wafer and certain others of said isolation trenches extending into said wafer to a second depth in said wafer that is less than said first depth;

forming a silicon layer on said one surface after said isolation trenches have been formed;

forming a reach-through region for bipolar collector contact;

forming sub-collector and interconnect regions in said silicon layer;

bonding said silicon layer to an oxide layer formed on the surface of a wafer substrate;

planarizing the other surface of said semiconductor wafer so that said isolation trenches that extend to said first depth extend to said planarized surface and there is a gap between said isolation trenches that extend to said second depth and said planarized surface.

2. A method of fabricating a silicon-on-oxide integrated circuit structure as in claim 1, including the further step of forming a reach-through region in said semiconductor wafer in order to form a collector contact for a bipolar device.

3. A method of fabricating a silicon-on-oxide integrated circuit structure as in claim 1, wherein said planarizing step is carried out by chemical-mechanical polishing.

4. A method of fabricating a silicon-on-oxide integrated circuit structure as in claim 1, including the further steps of:

forming a field effect device in said gap between said isolation trenches that extend to said second depth anti said planarized surface; and forming a bipolar transistor between said isolation trenches that extend to said first depth.

\* \* \* \* \*